(12) United States Patent
Ali et al.

(10) Patent No.: US 10,815,563 B2
(45) Date of Patent: Oct. 27, 2020

(54) LINEAR SOURCE APPARATUS, SYSTEM AND METHOD OF USE

(71) Applicant: eMagin Corporation, Hopewell Junction, NY (US)

(72) Inventors: Tariq Ali, Hopewell Junction, NY (US); Ilyas I. Khayrullin, Hopewell Junction, NY (US); Amalkumar P. Ghosh, Hopewell Junction, NY (US); Evan P. Donoghue, Hopewell Junction, NY (US); Qi Wang, Hopewell Junction, NY (US); Fridrich Vazan, Pittsford, NY (US); Kerry Tice, Hopewell Junction, NY (US); Laurie Sziklas, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 84 days.

(21) Appl. No.: 16/124,568

(22) Filed: Sep. 7, 2018

(65) Prior Publication Data
US 2019/0106782 A1    Apr. 11, 2019

Related U.S. Application Data

(60) Provisional application No. 62/568,609, filed on Oct. 5, 2017.

(51) Int. Cl.
*C23C 14/28* (2006.01)
*C23C 14/24* (2006.01)

(52) U.S. Cl.
CPC ............ *C23C 14/28* (2013.01); *C23C 14/243* (2013.01)

(58) Field of Classification Search
CPC .............................. C23C 14/243; C23C 14/28
See application file for complete search history.

(56) References Cited

U.S. PATENT DOCUMENTS

| | | | |
|---|---|---|---|
| 4,662,981 | A | 5/1987 | Fujiyasu et al. |
| 9,783,881 | B2 | 10/2017 | Liang et al. |
| 9,957,607 | B2 | 5/2018 | Tung et al. |

*Primary Examiner* — Joseph A Miller, Jr.
(74) *Attorney, Agent, or Firm* — Kaplan Breyer Schwarz, LLP

(57) ABSTRACT

A linear evaporation apparatus, system and method including a conductance chamber including a linear output section configured to emit a linear source deposition flux therethrough, an evaporative vapor communication conduit including an evaporative vapor mixing chamber and a plurality of crucible-receiving apertures at distal ends from the evaporative vapor mixing chamber, wherein the evaporative vapor mixing chamber is in communication with the conductance chamber and configured to transmit the linear source deposition flux therethrough, and a plurality of crucibles, each of the plurality of crucibles corresponding to one of the plurality of crucible-receiving apertures at the distal ends from the evaporative vapor mixing chamber, each of the plurality of crucibles configured to hold a material and heat the material to a corresponding material evaporation temperature, each of the plurality of crucibles further including a vapor pressure activated lid configured to open at a predetermined material vapor pressure value generated by heating the crucibles to at least the corresponding material evaporation temperature.

11 Claims, 5 Drawing Sheets ly single layers of atoms or molecules, perhaps as thin as one molecule), up to about 1 to 2,000 angstroms.

LINEAR SOURCE APPARATUS, SYSTEM AND METHOD OF USE

BACKGROUND

1. Field of the Invention

The present invention relates to organic light emitting diodes (OLEDs). In particular, fabrication of devices using single source with multiple hosts or host/dopant system incorporated into a single linear evaporation source for uniform coatings.

2. Description of Prior Art

An OLED device typically includes a stack of thin layers formed on a substrate. A light-emitting layer of a luminescent organic solid, as well as adjacent semiconductor layers, is sandwiched between a cathode and an anode. The light-emitting layer may be selected from any of a multitude of fluorescent and phosphorescent organic solids. Any of the layers, and particularly the light-emitting layer, also referred to herein as the emissive layer or the organic emissive layer, may consist of multiple sublayers.

In a typical OLED display, either the cathode or the anode is transparent or semitransparent. The films may be formed by evaporation, spin casting, chemical self-assembly or any other appropriate polymer film-forming techniques. Thicknesses typically range from a few monolayers (i.e., a single, closely packed layer of atoms or molecules, perhaps as thin as one molecule), up to about 1 to 2,000 angstroms.

High resolution displays may include millions of pixels and sub-pixels that are individually addressed by the drive electronics. The pixels can be formed by patterning anode and depositing blanket organic layers to form a monochrome display or form RGB side by side direct patterned pixels. One of the methods for forming these layers are deposited by using single material linear sources bundled together. Unfortunately, this arrangement takes too much space and does not mix the vapor for mixed host/dopant or multiple host systems from multiple linear sources rather it deposits in layers, which is undesirable.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, a linear evaporation apparatus includes a conductance chamber including a linear output section configured to emit a linear source deposition flux therethrough, an evaporative vapor communication conduit having an evaporative vapor mixing chamber and a plurality of crucible-receiving apertures at distal ends from the evaporative vapor mixing chamber, wherein the evaporative vapor mixing chamber is in communication with the conductance chamber and configured to transmit the linear source deposition flux therethrough. The linear evaporation apparatus further includes a plurality of crucibles, where each of the plurality of crucibles corresponding to one of the plurality of crucible-receiving apertures at the distal ends from the evaporative vapor mixing chamber, each of the plurality of crucibles configured to hold a material and heat the material to a corresponding material evaporation temperature, and each of the plurality of crucibles further including a vapor pressure activated lid configured to open at a predetermined material vapor pressure value generated by heating the crucibles to at least the corresponding material evaporation temperature.

In another embodiment disclosed herein a linear evaporation system includes linear evaporation apparatus having a conductance chamber including a linear output section configured to emit a linear source deposition flux therethrough, an evaporative vapor communication conduit including an evaporative vapor mixing chamber and a plurality of crucible-receiving apertures at distal ends from the evaporative vapor mixing chamber, wherein the evaporative vapor mixing chamber is in communication with the conductance chamber. The linear evaporation apparatus further including a plurality of crucibles, each of the plurality of crucibles corresponding to one of the plurality of crucible-receiving apertures at the distal ends from the evaporative vapor mixing chamber, each of the plurality of crucibles configured to hold a material and heat the material to a corresponding material evaporation temperature, and each of the plurality of crucibles further including a vapor pressure activated lid configured to open at a predetermined material vapor pressure value generated by heating the crucibles to at least the corresponding material evaporation temperature. The linear evaporation system further including a conductance chamber heater, and at least one crucible heater configured to heat material in at least one crucible of the plurality of crucibles to a corresponding material evaporation temperature.

In another embodiment disclosed herein, a method of operating a linear evaporation apparatus, includes providing linear evaporation apparatus including a conductance chamber including a linear output section configured to emit a linear source deposition flux therethrough, an evaporative vapor communication conduit having an evaporative vapor mixing chamber and a plurality of crucible-receiving apertures at distal ends from the evaporative vapor mixing chamber, wherein the evaporative vapor mixing chamber is in communication with the conductance chamber. The linear evaporation apparatus further includes a plurality of crucibles, wherein each of the plurality of crucibles corresponding to one of the plurality of crucible-receiving apertures at the distal ends from the evaporative vapor mixing chamber, each of the plurality of crucibles configured to hold a material and heat the material to a corresponding material evaporation temperature, and each of the plurality of crucibles further including a vapor pressure activated lid configured to open at a predetermined material vapor pressure value generated by heating evaporative material in the crucibles to at least the corresponding material evaporation temperature.

The method of operating the linear evaporation apparatus further includes providing at least one crucible heater configured to heat material in the plurality of crucibles to corresponding material evaporation temperatures, heating a first material in a first crucible of the plurality of crucibles to a corresponding first material evaporation temperature, opening a first vapor pressure activated lid on the first crucible based on heating the first material beyond the corresponding first material evaporation temperature. The method further includes heating a second material in a second crucible of the plurality of crucibles to a corresponding second material evaporation temperature, opening a second vapor pressure activated lid on the second crucible based on heating the second material beyond the corresponding second material evaporation temperature, and mixing evaporated first material and evaporated second material in the evaporative vapor mixing chamber of the evaporative vapor communication conduit. The method further includes ejecting the mixed evaporated first material and evaporated second material from the conductance chamber through the linear output section as the linear source deposition flux.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

To deposit uniform layers of the multiple mixed hosts and host/dopant layers using linear sources, a modified linear source is proposed which will be used for forming uniform thin film layers for an organic semiconductor device. The linear source will comprise of multiple crucibles for organic materials to be evaporated with one side of the crucible having an opening. A crucible lid is attached which opens under vapor pressure allowing the material from multiple sources into a mixing tube and also prevents the vapor of the evaporating material of entering into the crucible of non-evaporating crucible, the mixing tube opens into a conductance channel.

The crucibles are heated to increase temperature of the crucible to form vapor pressure. The vapor pressure from multiple crucibles is mixed inside the heated mixing tube, which then enters the heated conductance channel so that evaporated deposition material is ejected from the nozzles to form a deposition flux.

Figure 1:
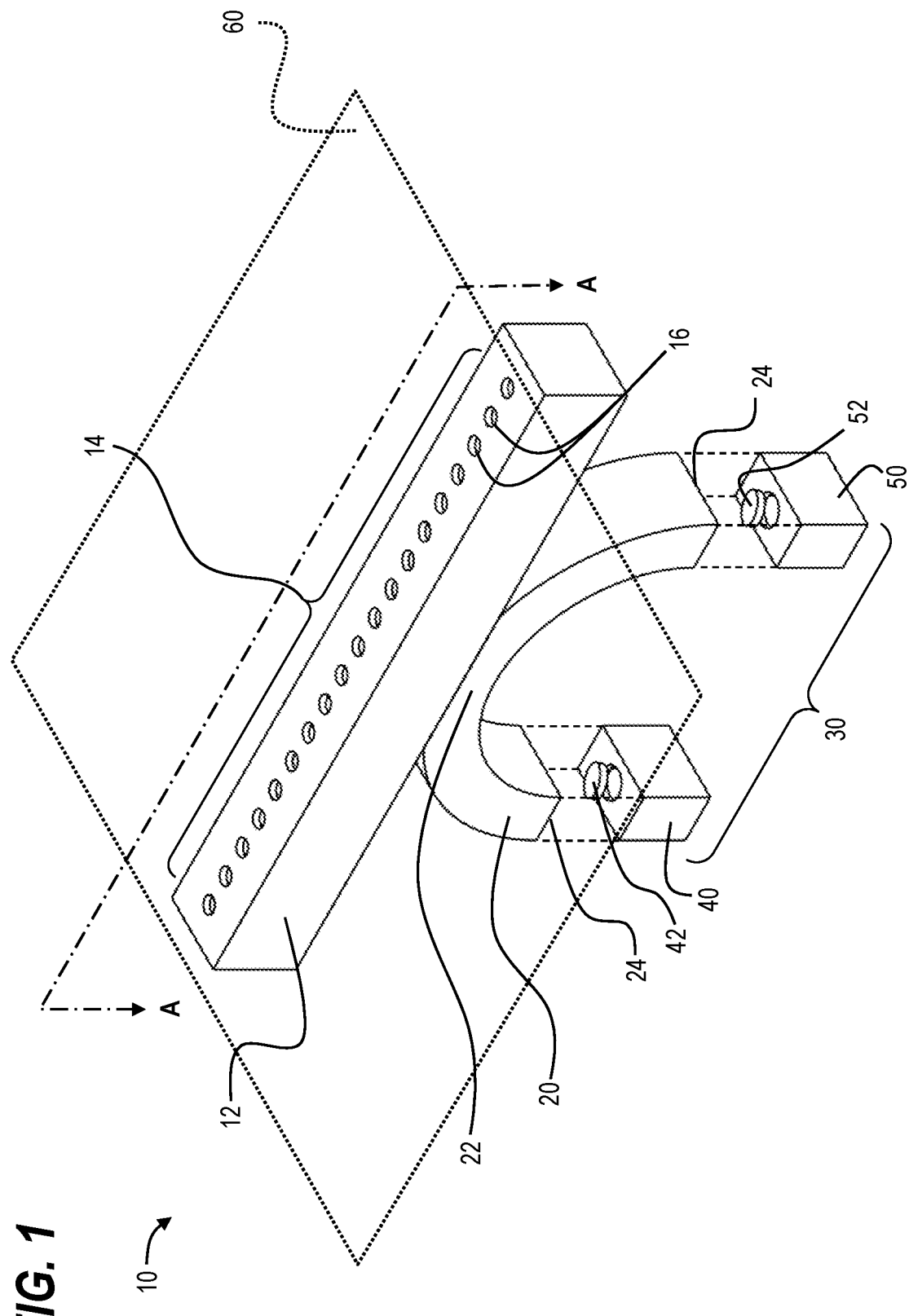
FIG. 1 illustrates a perspective exploded view of the linear evaporative apparatus.

The disclosure describes a single point linear evaporation of multiple hosts or host/dopant deposition system as shown in FIG. 1. It is comprised of two or more crucibles with vapor pressure release lids, mixing tube, conductance channel comprising of an elongated chamber with a plurality of nozzles arranged in a linear array depositing mixed vapor onto the substrate. The disclosure improves the uniformity of the film deposited on the substrate and occupies less space than conventional bundled linear sources.

Figure 2:
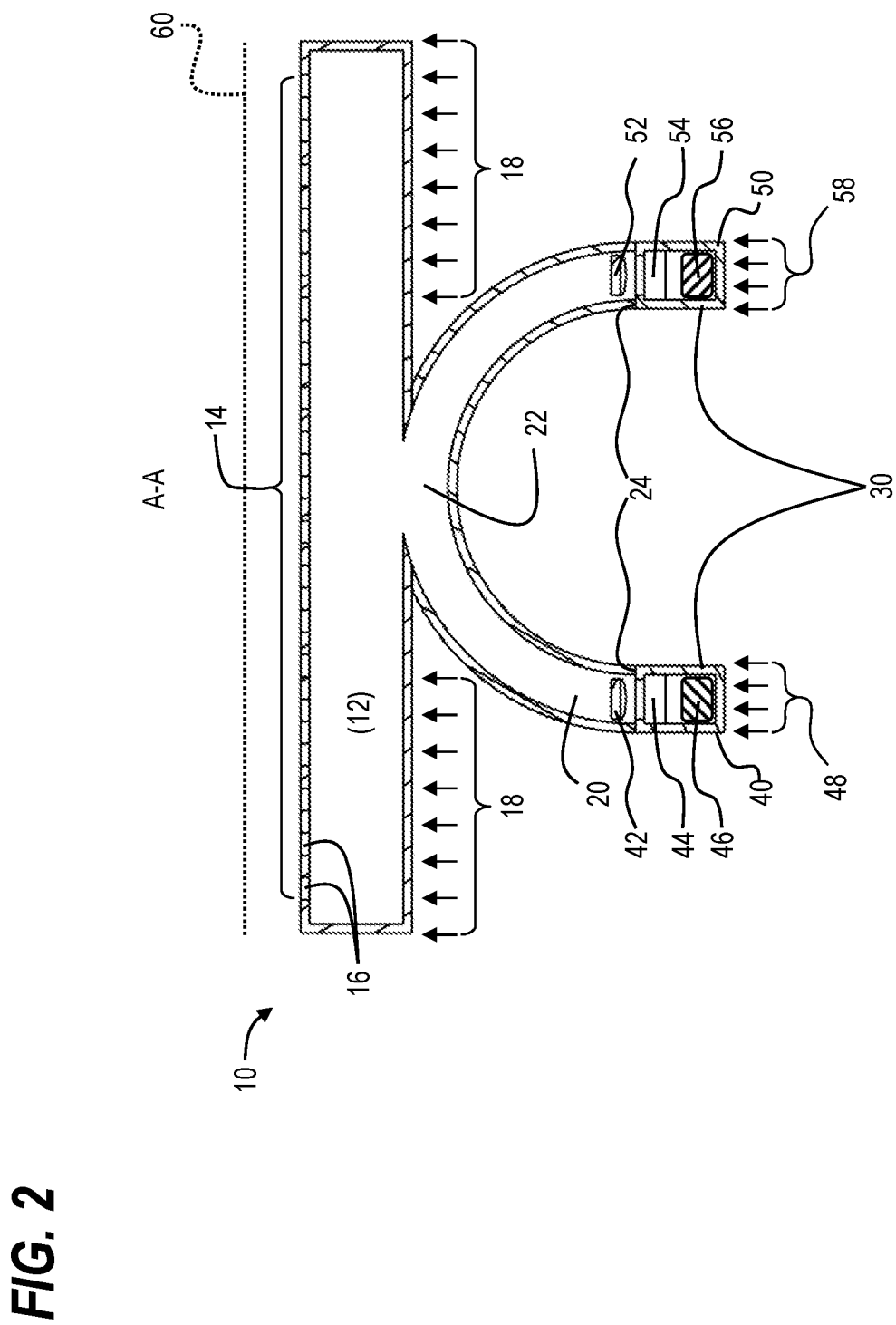
FIG. 2 illustrates a cross-section of line A-A in FIG. 1 of the linear evaporative apparatus.

FIG. 1 illustrates a perspective exploded view of the linear evaporative apparatus 10, and FIG. 2 illustrates a cross-section of line A-A in FIG. 1 of the linear evaporative apparatus 10. The linear evaporation apparatus 10 includes a conductance chamber 12 and a linear output section 14 including a plurality of linear array apertures 16 disposed along a top surface. A heat source 18 may heat the conductance chamber 12 to provide thermal energy to the deposition flux as it is travels through the conductance chamber 12 and out the linear output section 14 to be deposited on an adjacent target substrate 60.

Figure 3:
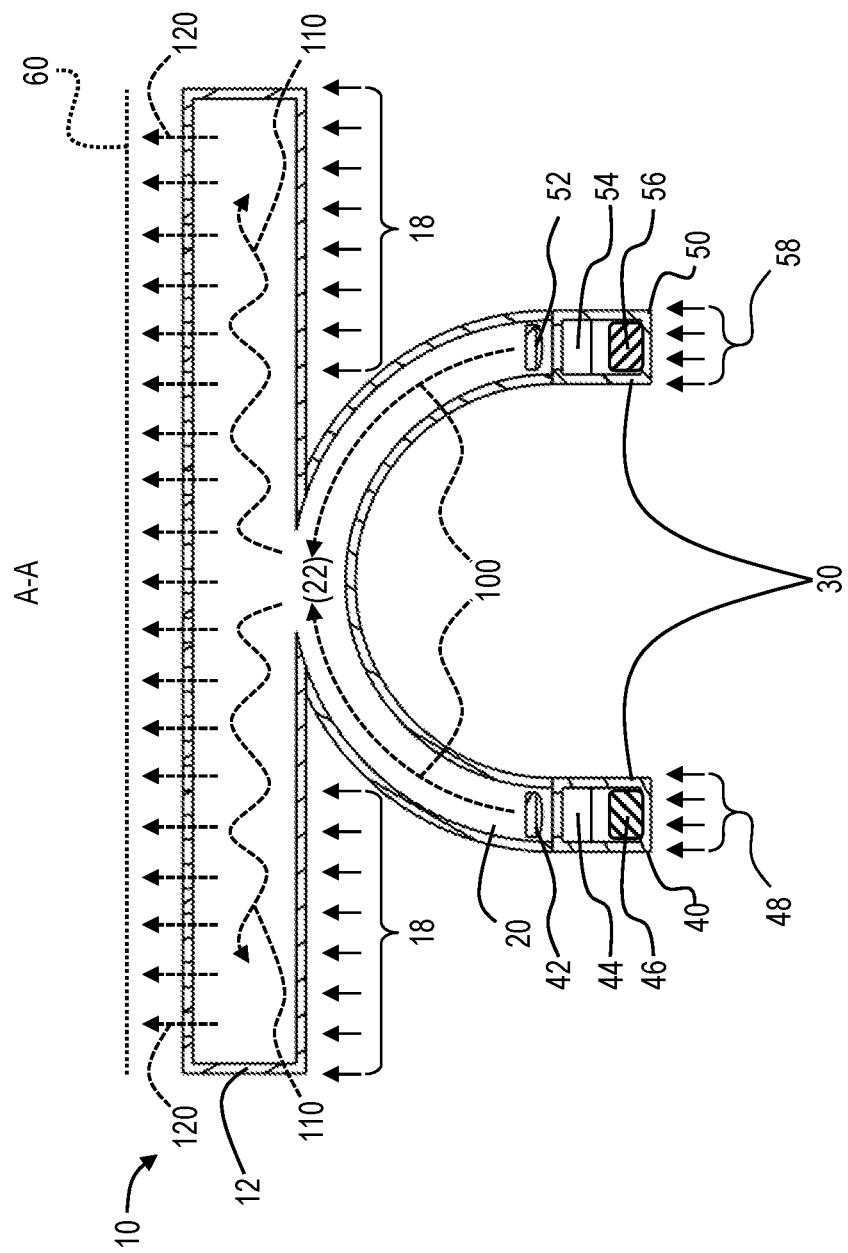
FIG. 3 illustrates an alternative flow diagram of the cross-section of line A-A in FIG. 1 of the linear evaporative apparatus.

The linear evaporative apparatus 10 further includes a vapor communication conduit 20 having a centrally located evaporative vapor mixing chamber 22 in communication with the interior portion of the conductance chamber 12. The vapor communication conduit 20 further including a plurality of crucible-receiving apertures 24 disposed at distal ends of the vapor communication conduit 20. FIGS. 1-3 illustrate two crucible-receiving apertures 24 to receive a corresponding plurality of crucibles 30, however, there may be more than two crucible-receiving apertures 24 in communication with the evaporative vapor mixing chamber 22 depending on the total number of crucibles, i.e., the total number of difference evaporative materials to be heated within the crucibles to be combined to produce the deposition flux output from the linear output section 14.

As illustrated, a first crucible 40 includes a material vapor pressure lid 42 including a first pressure-activated biasing member 44 for opening the first material vapor pressure lid 42 when a first vapor pressure within the crucible is above a first predetermined vapor pressure when a first deposition material 46 is heated to a first evaporative vapor emitting temperature by a first heating source 48.

Likewise, a second crucible 50 includes a material vapor pressure lid 52 including a second pressure-activated biasing member 54 for opening the second material vapor pressure lid 52 when a second vapor pressure within the crucible is above a second predetermined vapor pressure when a second deposition material 56 is heated to a second evaporative vapor emitting temperature by a second heating source 58.

FIG. 3 illustrates an alternative flow diagram of evaporative material within the cross-section of line A-A in FIG. 1 of the linear evaporative apparatus. When the first heater 48 and second heater 58 heat the respective first material 46 in the first crucible 40 and second material 56 within the second crucible 50, an evaporative material vapor pressure is generated by the heated material. When the evaporative material vapor pressure of each respective material is greater than a spring biasing force supplied by the spring biasing members 44, 54 of each respective crucible 40, 50, the material vapor pressure lids 42, 52 independently open to allow evaporative material to flow 100 from the respective crucibles 40, 50 into the crucible-receiving apertures 24 of the vapor communication conduit 20 such that the evaporative material of each crucible flows 100 in the direction of the evaporative vapor mixing chamber 22. After the evaporative materials meet at the evaporative vapor mixing chamber 22, the mixed evaporative material 110 flows into and through conductance chamber 12 until the mixed evaporative material flows out of the linear output section 14 as a linear source deposition flux output 120.

In summary, the linear evaporation apparatus 10 includes a conductance chamber 12 including a linear output section 14 configured to emit a linear source deposition flux 120 therethrough. The linear evaporation apparatus 10 further includes an evaporative vapor communication conduit 20 including an evaporative vapor mixing chamber 22 and a plurality of crucible-receiving apertures 24 at distal ends from the evaporative vapor mixing chamber 22, wherein the evaporative vapor mixing chamber 22 is in communication with the conductance chamber 12 and configured to transmit the linear source deposition flux 120 therethrough.

The linear evaporation apparatus 10 further includes a plurality of crucibles 30 (e.g., 40 and 50), wherein each of the plurality of crucibles 30 corresponding to one of the plurality of crucible-receiving apertures 24 at the distal ends from the evaporative vapor mixing chamber 22. Each of the plurality of crucibles 30 are further configured to hold a material 46, 56 and heat (via heaters 48, 58) the material 46, 56 to a corresponding material evaporation temperature. Each of the plurality of crucibles further include a vapor pressure activated lid 42, 52 configured to open at a predetermined material vapor pressure value generated by heating the crucibles to at least the corresponding material evaporation temperature.

The linear evaporation apparatus further includes a heated conductance chamber 12 supplied by a heater 18.

The linear output section 14 may further include at least one linear array of apertures for outputting the linear source deposition flux 120 therethrough.

A first material 46 may be heated within a first of the plurality of crucibles 40 to a corresponding first material evaporation temperature. Likewise, a second material 56 may be heated within a second of the plurality crucibles 50 to a corresponding second material evaporation temperature. The vapor pressure activated lid 42, 52 for the corresponding first 40 and second 50 plurality of crucibles is configured to open after each material 46, 56 reaches the corresponding material evaporation temperatures.

Each vapor pressure activated lid 42, 52 may be configured to close at a crucible vapor pressure value at or below a predetermined material vapor pressure value.

A linear evaporation system as described herein includes linear evaporation apparatus 10 including a conductance chamber 12 including a linear output section 14 configured to emit a linear source deposition flux 120 therethrough, an evaporative vapor communication conduit 20 having an evaporative vapor mixing chamber 22 and a plurality of crucible-receiving apertures 24 at distal ends from the evaporative vapor mixing chamber 22, wherein the evaporative vapor mixing chamber 22 is in communication with the conductance chamber 12. The linear evaporation apparatus may further include a plurality of crucibles 30, where each of the plurality of crucibles 40, 50 corresponds to one of the plurality of crucible-receiving apertures 24 at the distal ends from the evaporative vapor mixing chamber 22, each of the plurality of crucibles 40, 50 configured to hold a material 46, 56 and heat the material to a corresponding material evaporation temperature, and each of the plurality of crucibles further including a vapor pressure activated lid 42, 52 configured to open at a predetermined material vapor pressure value generated by heating the crucibles 30 to at least the corresponding material evaporation temperature.

The linear evaporation system may further include a conductance chamber heater 18, and at least one crucible heater 48, 58 configured to heat material in at least one crucible of the plurality of crucibles to a corresponding material evaporation temperature.

The linear output section 14 of the linear evaporation system further comprises at least one linear array of apertures 14.

The linear evaporation system is configured to heat a first material e.g., 46, within a first of the plurality of crucibles 40 to a corresponding first material evaporation temperature, and heat a second material, e.g., 56, within a second of the plurality crucibles 50 to a corresponding second material evaporation temperature.

The linear evaporation apparatus system is configured to open the vapor pressure activated lids 42, 52 for the respective first and second of the plurality of crucibles 40, 50 after each material 46, 56 reaches the corresponding material evaporation temperature.

The linear evaporation apparatus system includes a spring biasing member 44, 54 for each vapor pressure activated lid 42, 52 configured to keep the vapor pressure activated lid in a closed position relative to the respective crucible 40, 50 when a crucible vapor pressure value is below the predetermined material vapor pressure value.

The linear evaporation apparatus system is further configured to close each vapor pressure activated lid 42, 52 at a crucible vapor pressure value at or below the predetermined material vapor pressure value.

Figure 4:
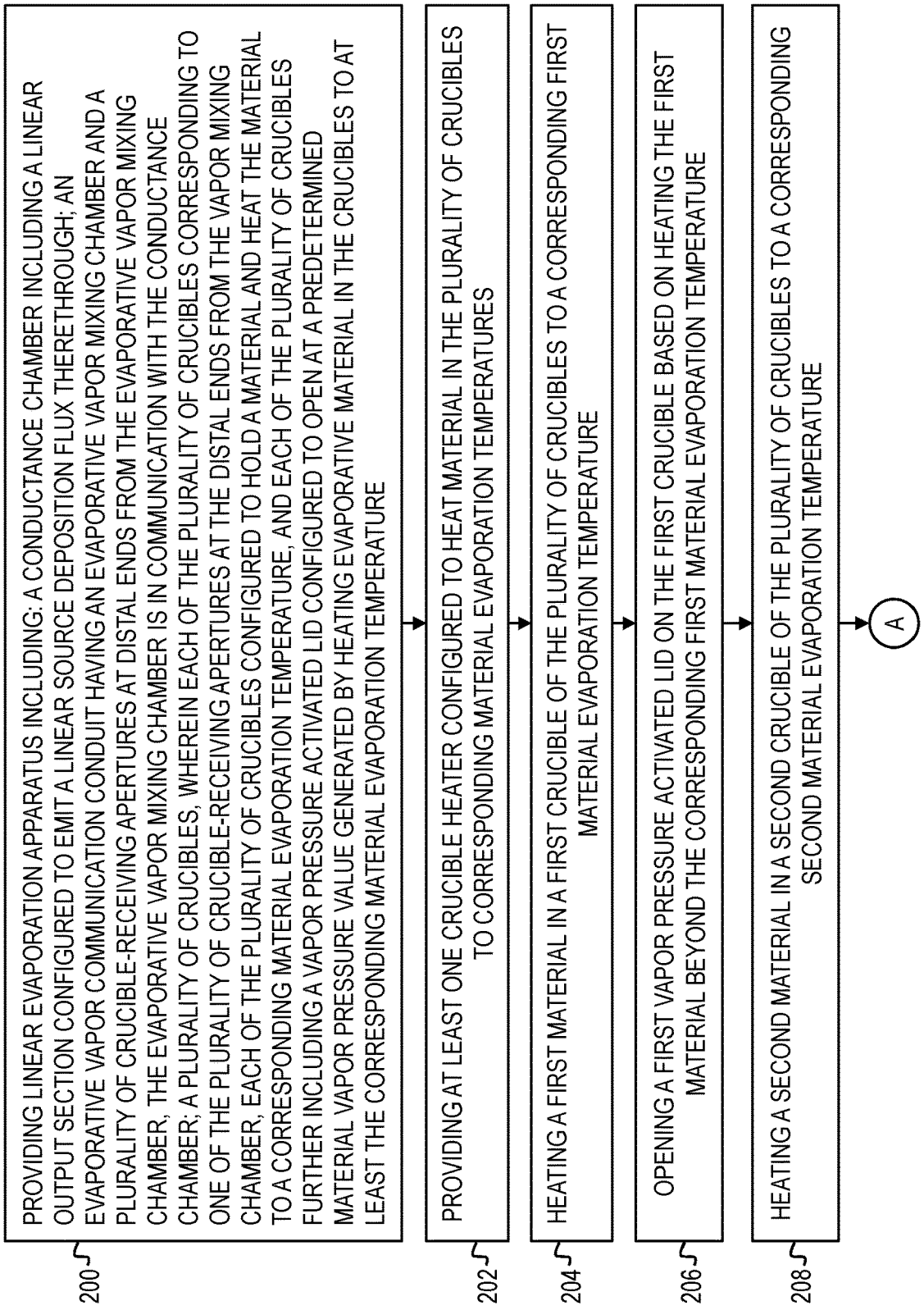
FIGS. 4-5 illustrates a logic diagram of a method of operating a linear evaporative system of the embodiments illustrated in FIGS. 1-3.
Figure 5:
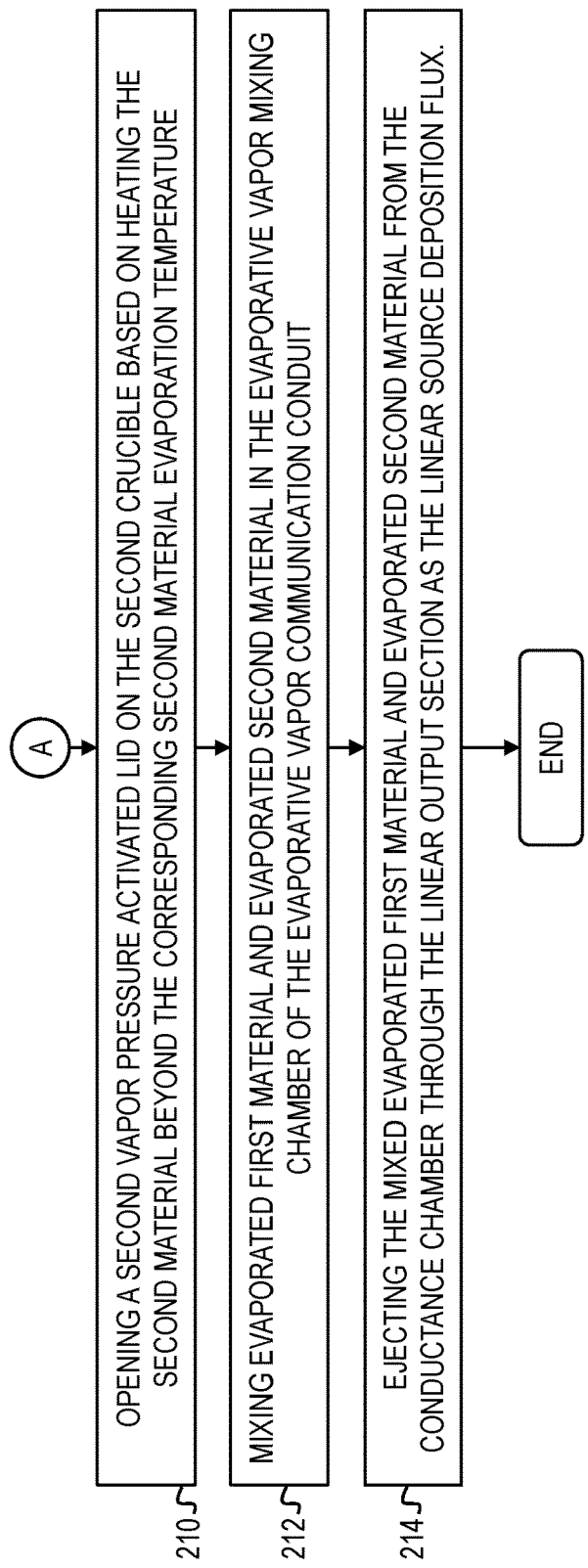

FIGS. 4-5 illustrates a logic diagram of a method of operating a linear evaporative system of the embodiments illustrated in FIGS. 1-3.

FIGS. 4-5 illustrates a method of operating a linear evaporation apparatus, including providing 200 a linear evaporation apparatus, (as illustrated in FIGS. 1-3), including: a conductance chamber 12 including a linear output section 14 configured to emit a linear source deposition flux 120 therethrough; an evaporative vapor communication conduit 20 having an evaporative vapor mixing chamber 22 and a plurality of crucible-receiving apertures 24 at distal ends from the evaporative vapor mixing chamber 22, wherein the evaporative vapor mixing chamber 22 is in communication with the conductance chamber 12; and a plurality of crucibles 30, wherein each of the plurality of crucibles 30 corresponds to one of the plurality of crucible-receiving apertures 24 at the distal ends from the evaporative vapor mixing chamber 22, each of the plurality of crucibles 30 configured to hold a material 46, 56 and heat the material to a corresponding material evaporation temperature, and each of the plurality of crucibles 30 further including a vapor pressure activated lid 42, 52 configured to open at a predetermined material vapor pressure value generated by heating evaporative material 46, 56 in the crucibles to at least the corresponding material evaporation temperature.

The method further includes providing 202 at least one crucible heater configured to heat material in the plurality of crucibles to corresponding material evaporation temperatures.

The method further includes heating 204 a first material in a first crucible of the plurality of crucibles to a corresponding first material evaporation temperature and opening 206 a first vapor pressure activated lid on the first crucible based on heating the first material beyond the corresponding first material evaporation temperature.

The method further includes heating 208 a second material in a second crucible of the plurality of crucibles to a corresponding second material evaporation temperature and opening 210 a second vapor pressure activated lid on the second crucible based on heating the second material beyond the corresponding second material evaporation temperature.

The method further includes mixing 212 evaporated first material and evaporated second material in the evaporative vapor mixing chamber of the evaporative vapor communication conduit and ejecting 214 the mixed evaporated first material and evaporated second material from the conductance chamber through the linear output section as the linear source deposition flux.

The method further includes providing a conductance chamber heater.

The method further includes providing the linear output section with at least one linear array of apertures.

The method further includes providing each pressure activated lid with a spring biasing member configured to keep the vapor pressure activated lid in a closed position relative to the crucible when a crucible vapor pressure value is below the predetermined material vapor pressure value.

The method further causing the opening the first vapor pressure activated lid on the first crucible by a first crucible vapor pressure value being greater than a first force provided by a first spring biasing member on the first crucible, and causing the second vapor pressure activated lid on the second crucible by a second crucible vapor pressure value being greater than a second force provided by a second spring biasing member on the second crucible.

The method further includes closing at least one of the first or second pressure activated lids when at crucible vapor pressure value falls below the predetermined material vapor pressure value.

The advantages of linear evaporation apparatus, system and method of operation thereof to deposit a linear source deposition flux on a substrate provides uniform coatings of multiple hosts and host/dopant organic layers on the substrate and a total space saving of the apparatus in the fabrication/deposition environment.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A linear evaporation apparatus comprising:
   a conductance chamber including a linear output section configured to emit a linear source deposition flux therethrough;
   an evaporative vapor communication conduit comprising
   an evaporative vapor mixing chamber and
   a plurality of crucible-receiving apertures at distal ends from the evaporative vapor mixing chamber, wherein the evaporative vapor mixing chamber is in communication with the conductance chamber and configured to transmit the linear source deposition flux therethrough; and
   a plurality of crucibles,
   each of the plurality of crucibles corresponding to one of the plurality of crucible-receiving apertures at the distal ends from the evaporative vapor mixing chamber,
   each of the plurality of crucibles configured to hold a material and heat the material to a corresponding material evaporation temperature,
   each of the plurality of crucibles further including:
      (i) a vapor pressure activated lid configured to open at a predetermined material vapor pressure value generated by heating the crucibles to at least the corresponding material evaporation temperature; and
      (ii) a spring biasing member configured to keep the vapor pressure activated lid in a closed position relative to the crucible when the material vapor pressure is less than the predetermined material vapor pressure value.

2. The linear evaporation apparatus according to claim 1, wherein the conductance chamber is heated.

3. The linear evaporation apparatus according to claim 1, wherein the linear output section further comprises at least one linear array of apertures.

4. The linear evaporation apparatus according to claim 1, wherein a first material is configured to be heated within a first of the plurality of crucibles to a corresponding first material evaporation temperature.

5. The linear evaporation apparatus according to claim 4, wherein a second material is configured to be heated within a second of the plurality crucibles to a corresponding second material evaporation temperature.

6. The linear evaporation apparatus according to claim 1, wherein each vapor pressure activated lid is configured to close at a crucible vapor pressure value at or below the predetermined material vapor pressure value.

7. A linear evaporation system comprising:
   linear evaporation apparatus including
      a conductance chamber including a linear output section configured to emit a linear source deposition flux therethrough;
      an evaporative vapor communication conduit comprising
      an evaporative vapor mixing chamber and
      a plurality of crucible-receiving apertures at distal ends from the evaporative vapor mixing chamber, wherein the evaporative vapor mixing chamber is in communication with the conductance chamber; and
      a plurality of crucibles,
      each of the plurality of crucibles corresponding to one of the plurality of crucible-receiving apertures at the distal ends from the evaporative vapor mixing chamber,
      each of the plurality of crucibles configured to hold a material and heat the material to a corresponding material evaporation temperature,
      each of the plurality of crucibles further including a vapor pressure activated lid having a spring biasing member that is configured to keep the vapor pressure activated lid in a closed position relative to the crucible when a crucible vapor pressure value is below a predetermined material vapor pressure value generated by heating the crucible to at least the corresponding material evaporation temperature, wherein the vapor pressure activated lid is configured to open at or above the predetermined material vapor pressure value;
   a conductance chamber heater; and
   at least one crucible heater configured to heat material in at least one crucible of the plurality of crucibles to a corresponding material evaporation temperature.

8. The linear evaporation apparatus system according to claim 7, wherein the linear output section further comprises at least one linear array of apertures.

9. The linear evaporation apparatus system according to claim 7, wherein a first material is configured to be heated within a first of the plurality of crucibles to a corresponding first material evaporation temperature.

10. The linear evaporation apparatus system according to claim 9, wherein a second material is configured to be heated within a second of the plurality of crucibles to a corresponding second material evaporation temperature.

11. The linear evaporation apparatus system according to claim 7, wherein each vapor pressure activated lid is configured to close at a crucible vapor pressure value at or below the predetermined material vapor pressure value.

* * * * *